(12) United States Patent
Wanner

(10) Patent No.: US 11,635,798 B2
(45) Date of Patent: Apr. 25, 2023

(54) DYNAMIC OCP ADJUSTMENT

(71) Applicant: HEWLETT PACKARD ENTERPRISE DEVELOPMENT LP, Houston, TX (US)

(72) Inventor: Christopher C. Wanner, Tomball, TX (US)

(73) Assignee: Hewlett Packard Enterprise Development LP, Spring, TX (US)

( * ) Notice: Subject to any disclaimer, the term of this patent is extended or adjusted under 35 U.S.C. 154(b) by 893 days.

(21) Appl. No.: 16/354,091

(22) Filed: Mar. 14, 2019

(65) Prior Publication Data

US 2020/0257348 A1 Aug. 13, 2020

Related U.S. Application Data

(60) Provisional application No. 62/803,355, filed on Feb. 8, 2019.

(51) Int. Cl.
*H02H 3/08* (2006.01)
*G06F 1/28* (2006.01)
(Continued)

(52) U.S. Cl.
CPC .............. *G06F 1/305* (2013.01); *G01R 11/00* (2013.01); *G06F 1/28* (2013.01); *H02H 3/006* (2013.01);
(Continued)

(58) Field of Classification Search
CPC .......... G06F 1/305; G06F 1/28; G06F 1/3206; G06F 11/0796; G06F 11/3041;
(Continued)

(56) References Cited

U.S. PATENT DOCUMENTS

2008/0222435 A1* 9/2008 Bolan ................... G06F 1/3203
713/310
2008/0249666 A1* 10/2008 Buterbaugh .............. G06F 1/28
700/293
(Continued)

OTHER PUBLICATIONS

Wiley ("Conductor Sizing and Overcurrent Device Ratings", Evolving Technologies, Jan./Feb. 2011, Perspectives on PV, Jan. 16, 2011) (Year: 2011).*

(Continued)

*Primary Examiner* — Daniel R Miller
*Assistant Examiner* — Christian T Bryant
(74) *Attorney, Agent, or Firm* — Hewlett Packard Enterprise Patent Department

(57) ABSTRACT

An example computing system may include computer module bays, a power subsystem to supply power to computer modules installed in the computer module bays, and a system controller. The power subsystem may also implement overcurrent protection (OCP) based on an OCP threshold parameter. The system controller may include dynamic OCP adjustment logic that repeatedly updates the OCP threshold parameter during normal operation of the computing system. The dynamic OCP adjustment logic may update the OCP threshold parameter by determining a power requirement of the computing system based on a current configuration of the computing system, determining a new OCP threshold based on the power requirement, and instructing the power subsystem to change a value of the OCP threshold parameter to a new value based on the new OCP threshold.

19 Claims, 10 Drawing Sheets

(51) Int. Cl.
  *G01R 11/00*   (2006.01)
  *H02H 3/087*   (2006.01)
  *G06F 1/3206*  (2019.01)
  *G06F 1/30*    (2006.01)
  *H02H 3/00*    (2006.01)
  *G06F 11/07*   (2006.01)

(52) U.S. Cl.
  CPC ............... *H02H 3/08* (2013.01); *G06F 1/30* (2013.01); *G06F 1/3206* (2013.01); *G06F 11/0796* (2013.01); *H02H 3/087* (2013.01)

(58) Field of Classification Search
  CPC ........... G06F 1/30; G01R 11/00; H02G 3/006; H02G 3/08; H02G 3/087; H02H 3/006; H02H 3/08; H02H 3/087
  See application file for complete search history.

(56) References Cited

U.S. PATENT DOCUMENTS

| | | | |
|---|---|---|---|
| 2011/0211282 A1* | 9/2011 | Nanov | H02M 1/32 |
| | | | 361/18 |
| 2016/0241058 A1* | 8/2016 | Carralero | H02J 7/007 |
| 2019/0146568 A1* | 5/2019 | Bose | G06F 1/3206 |
| | | | 713/340 |
| 2021/0021118 A1* | 1/2021 | Zeng | H02H 3/08 |

OTHER PUBLICATIONS

Eich ("Understanding overcurrent protection", Environmental Systems Design, Chicago, Aug. 17, 2017) (Year: 2017).*
SPEC (Power and Performance Benchmark Methodology V2.2, Standard Performance Evaluation Corporation (SPEC), Dec. 3, 2014) (Year: 2014).*

* cited by examiner

DYNAMIC OCP ADJUSTMENT

BACKGROUND

A power supply is a device that can provide power to an electronic device, such as a server. For example, a power supply may convert power from a form that is not suitable for the electronic device (such as an alternating current (AC) power signal) into a form that is suitable for the electronic device (such as direct current (DC) power signal having a specific voltage).

DETAILED DESCRIPTION

Figure 1:
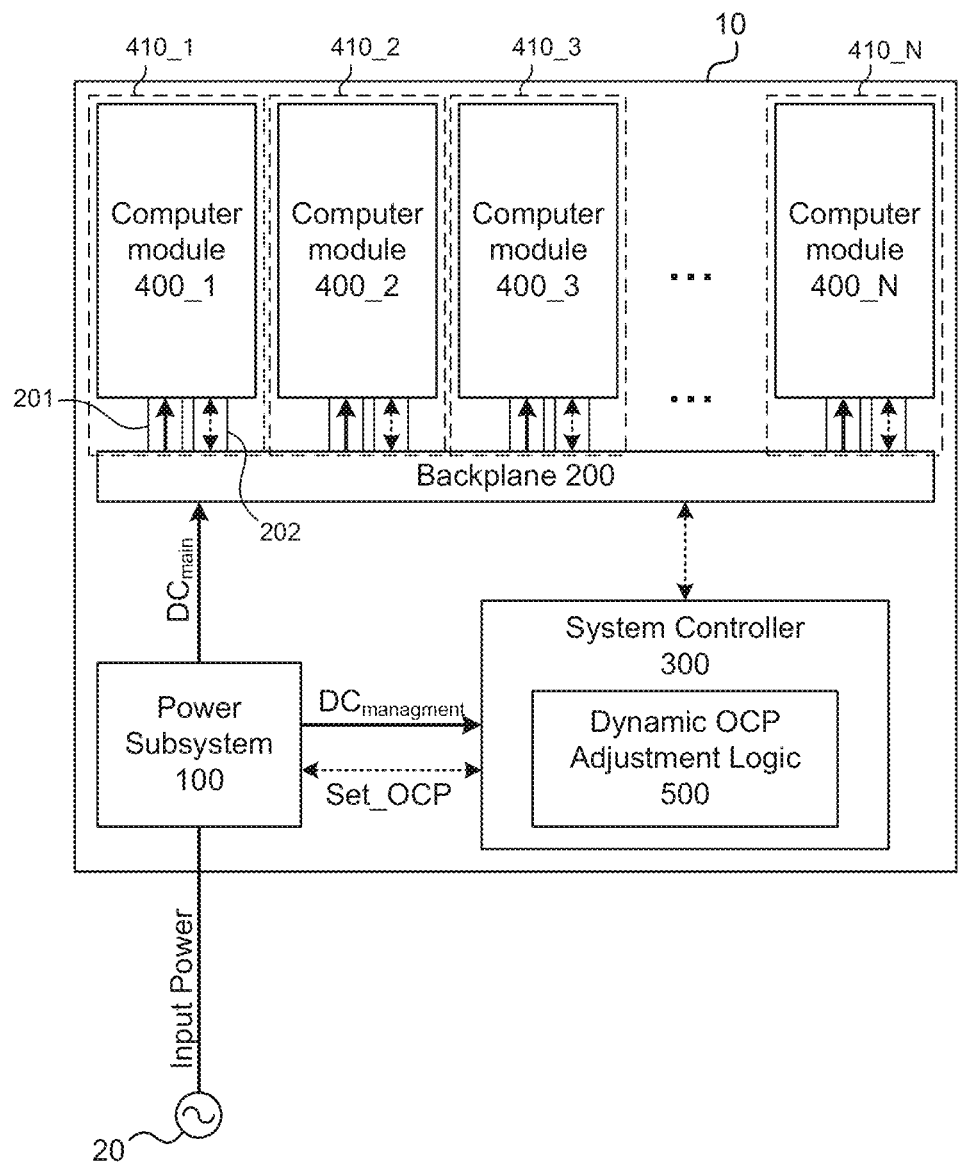
FIG. 1 is a block diagram illustrating an example computing system in which multiple computer modules can be installed.

Electrical systems, such as servers, may be susceptible to electrical faults that can degrade performance and damage the system. For example, a short may occur in a system as a result of failure of a component that was not manufactured up to specification or has some other flaw. Such a short could result in the system drawing too much current (referred to as an overcurrent condition), which may result in excessive heat generation that may cause components to fail and otherwise damage the system. In some cases, one fault may lead to other faults in a cascading fashion, multiplying the damage to the system. In extreme cases, fire or other severe thermal events may occur, resulting in the total destruction of the electrical system and possibly neighboring devices.

Accordingly, power supplies and electrical devices may include various countermeasures to prevent such faults and/or to mitigate damage when such faults occur. For example, fuses and circuit breakers may be used to prevent too much current from flowing through certain lines. Another mechanism to stop a short is an over-current protection (OCP) mechanism of the power supply units (PSUs) that are suppling power to the system. OCP involves the power supply monitoring the current that is being drawn, and cutting off the supply of power if the current exceeds a specified threshold, which may be referred to as an OCP level, OCP set point, or OCP threshold. Generally, the OCP level is a static pre-set value based upon the intended capacity of the PSU, with the OCP level usually exceeding the max capacity of the PSU by some small amount.

The effectiveness of the OCP feature to detect that a short has occurred and to prevent damage from resulting is dependent on how large the gap is between the power utilization of the system and the OCP threshold at the time of the short. Specifically, if the utilization of the power supply is low relative to the OCP threshold, then the short may be able to do significant damage before triggering the OCP protections, or might not even be detected by the OCP mechanism at all. This will be explained in greater detail below As the gap between the actual power utilization and the OCP threshold increases, there is more current that is available to feed through any short that occurs, and more current flowing through the short means more potential for damage. The reason why more current is available to feed through the short when power utilization is lower relative to the OCP threshold is because OCP will kick in and shut things down only when the total current exceeds the threshold, and the total current is the combination of the current flowing to the load and the current flowing through the short. In other words, if the normal (non-fault) current being drawn by the load is denoted $I_{load}$, the current drawn by the short is denoted $I_{short}$, and the OCP threshold is denoted $T_{OCP}$, then OCP will trigger when:

$$I_{short}+I_{load}=T_{OCP} \qquad (eq.\ 1)$$

Rearranging equation 1, it can be seen that $I_{short}$ is roughly equal to $T_{OCP}-I_{load}$ at the time that OCP triggers. Thus, the maximum magnitude of the current that can flow through the short before OCP is triggered is:

$$I_{short\_max}=T_{OCP}-I_{load} \qquad (eq.\ 2)$$

The difference $T_{OCP}-I_{load}$ represents the gap between the actual power utilization level ($I_{load}$) and the OCP threshold ($T_{OCP}$), and thus is referred to hereinafter as the "OCP gap". From equation 2 it can be seen that the higher the OCP gap is, the more current is available to flow through the short.

In addition, as noted above, not only does a larger OCP gap increase the likelihood of damage, a larger OCP gap also increases the likelihood that the short will not be detected by the OCP mechanism at all. As noted above, the OCP protections trigger when $I_{short}+I_{load}=I_{OCP}$. In other words, the OCP protections trigger when the magnitude of the current flowing through the short ($I_{short}$) equals or exceeds the OCP gap. However, if $I_{short}$ never becomes large enough to equal the OCP gap ($I_{OCP}-I_{load}$), then the OCP protections would never trigger at all. The likelihood that $I_{short}$ is less than the OCP gap increases as the OCP gap increases, and therefore the larger the OCP gap, the less likely that the short will trigger the OCP protections.

Figure 10A:
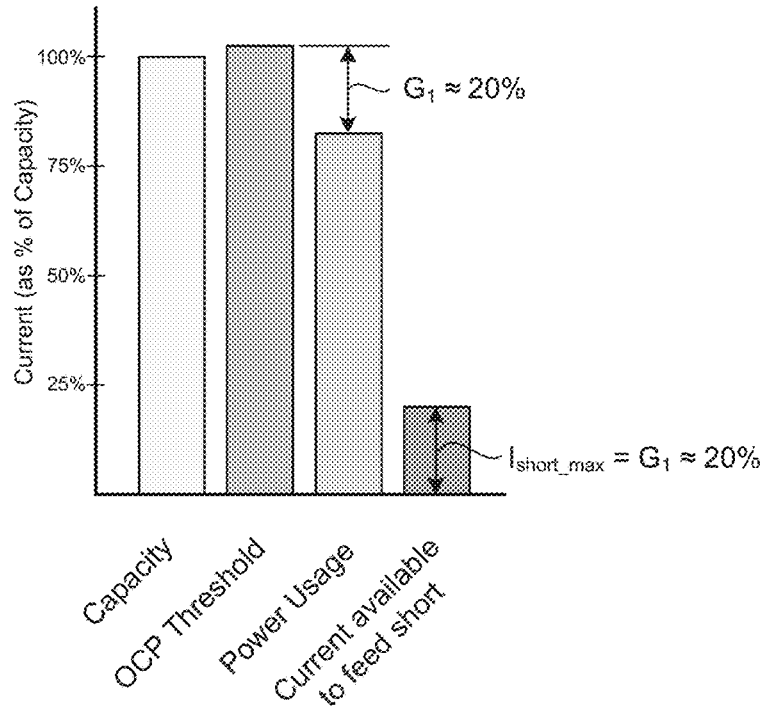
FIG. 10A is a bar graph illustrating the amount current that is available to feed a short in a scenario in which power usage of a computing system is relatively high.

The above-described principles may be better understood by considering some example scenarios. In one example scenario illustrated in FIG. 10A, power usage of the load is high (around 80% of the max capacity of the system). Because power usage is high in this scenario, the OCP gap ($G_1$) is small (approximately 20% of the capacity). Because the OCP gap is small, only a small amount of current (appx. 20% of the capacity) is available to be fed through the short before triggering OCP. Thus, in this scenario, the short is less likely to result in damage to the system. Furthermore, because only a small amount of current is needed to flow through the short before the OCP threshold is reached, it is more likely that the OCP protections will be triggered by the short.

Figure 10B:
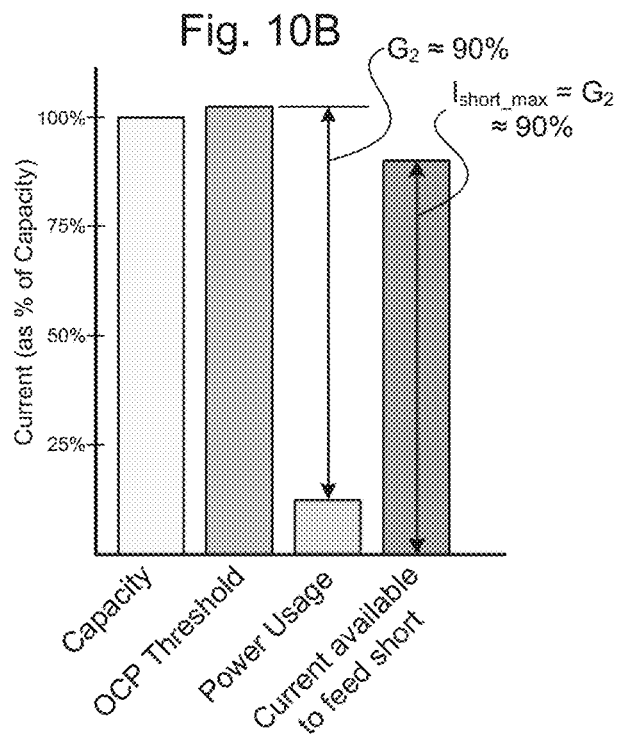
FIG. 10B is a bar graph illustrating the amount current that is available to feed a short in a scenario in which power usage of a computing system is relatively low.

On the other hand, FIG. 10B illustrates a second scenario in which the power usage of the load is low (around 10% of the max capacity of the system). Because power usage is much lower than the OCP threshold in this scenario, the OCP gap is large (approx. 90% of capacity). Because the OCP gap is large, a significant amount of current will be available to be drawn by the short before the OCP threshold is reached. Furthermore, because a large amount of current is needed to flow through the short before the OCP threshold is reached, it is more likely that the OCP protections will not be triggered by the short.

The above-noted concerns are especially pressing in large, multi-server systems with large power capacities, such as blade systems and high performance compute (HPC) systems. In such large systems, the capacities of the power subsystems can be very large, for example exceeding 16 KW or more. Conventionally, the OCP level is set to correspond to (or slightly exceed) the maximum current capacity of the system. Thus, when the power utilization is low in such high-power systems, the amount of power available to feed a short can be extremely high, with the potential to cause serious damage. For example, suppose that a 16 KW capacity system is operating at 10% power usage. This would mean that about 14.4 KW of power could potentially feed through a short.

Furthermore, it is not uncommon in real world use cases for the actual power usage of such a large system to be much less than the full capacity of the power subsystem. For example, a prevalent deployment practice is to maximize the power capacity of a system by installing a full complement of power supplies, even if the rest of the system (e.g., servers, etc.) is not being fully populated. By doing so a customer is able to deploy power once and yet handle varying amounts of servers, storage, and networking without the maintenance complexity and business disruption associated with adding or removing power feeds and PSUs to match the actual needs of the configuration. At the extreme, a customer may have a minimally populated system being staged for deployment sitting powered but idle for weeks or even months at a time and operating at power utilization levels as low as 2.5%. In these cases, there is an extremely large OCP gap and an incredible amount of power will have to be consumed by a short before the PSUs is able to respond. This OCP gap can be a thousand amps or more.

Thus, disclosed herein is an example system that may use OCP to detect shorts and prevent damage while overcoming some of the difficulties noted above. In particular, in example computing systems described herein, the OCP threshold is dynamically changed during system operation to more closely match the power usage of the load, thereby reducing the OCP gap to a safer level. For example, the computing system may determine a power requirement of the system and continually update the power requirement based on the current configuration of the system; the computing system also continually updates the OCP threshold based on the updated power requirement.

More specifically, in some examples, the computing system may determine the power requirement of the system by determining power allocations for each of the computing modules installed in the system based on the respective component level configurations of the computing modules. The power allocation for a computing module may be determined by identifying the individual computing components (e.g., processors, memory, storage drives, etc.) that are installed in the computing module, and estimating a power usage for the module based on its specific computing components. In some examples, the power allocation of a computing module may represent an estimation of the maximum power that the computing module would be expected to draw when fully loaded.

Once the updated power requirement has been determined, the computing system may set the OCP threshold to be equal to, or just a little higher than, the determined power requirement. For example, the OCP threshold may be set to be a fixed amount (e.g., 10A) higher than the determined power requirement. As another example, the OCP threshold may be set to be proportional to (e.g., 10% higher than) the determined power requirement.

Figure 10C:
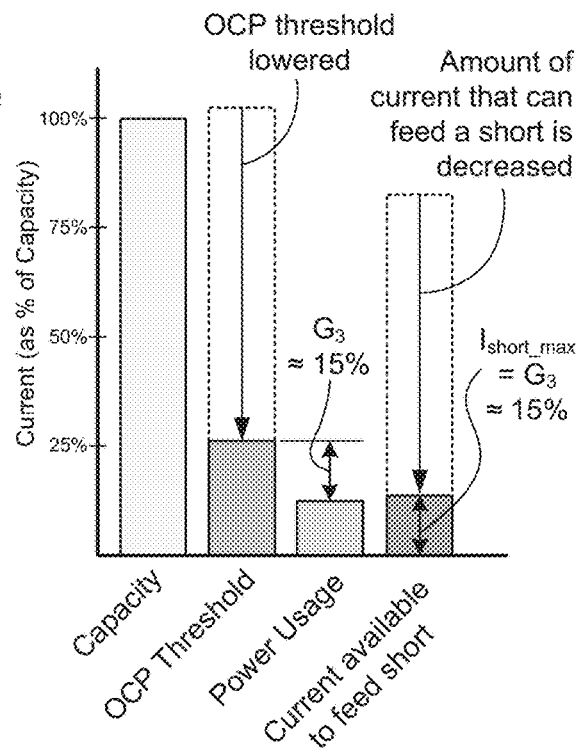
FIG. 10C is a bar graph illustrating the amount current that is available to feed a short in a scenario in which power usage of a computing system is relatively low and the OCP threshold has been adjusted.

Because the OCP level is updated based on the determined power requirement of the system, the OCP level may be kept very close to the actual power usage of the system. Thus, the size of the OCP gap may be reduced as compared to systems in which the OCP level is fixedly set to equal or exceed the maximum capacity of the system. For example, FIG. 10C illustrates a third scenario in which the power usage of the load is the same as it was in second scenario (FIG. 10B) (approximately 10% of capacity). However, unlike the second scenario (FIG. 10B), in the third scenario (FIG. 10C) the OCP threshold is dynamically adjusted based on the current system configuration as described above, resulting in the OCP threshold being much closer to the actual usage of the system. As a result, the OCP gap ($G_3$) in this scenario is greatly reduced (approx. 15%) relative to the OCP gap ($G_2$) of the second scenario (approx. 90%), and therefore there is less current available to flow through the short, which translates to a greater likelihood that the OCP mechanism detects the short before the short causes damage.

The examples described herein may be contrasted with an alternative approach in which the OCP level of a PSU is set (manually or automatically) at or during installation or power-on of the system. In this alternative approach, once the OCP level is set, it remains unchanged during system operation. Under this approach, it might be possible to change the OCP level away from its initial value, but this would only occur when the system is reset or when the power subsystem is manually reprogramed or the like. This approach may mitigate some of the difficulties with OCP protection that were noted above, as it may enable the OCP level to be set to a value that is closer to an anticipated power requirement of the system when the system is initially installed or later reprogrammed.

However, unlike the examples disclosed herein, the alternative approach may not be well equipped to handle scenarios in which the configuration of the system changes during usage, such as when computer modules are added or removed and/or when computing components are added to or removed from individual computing modules. When the configuration of the system changes, the amount of power that the system is likely to draw also changes, but in the alternative approach the OCP level does not change to reflect this (at least not without resetting of the system and/or manual reprogramming, which are cumbersome). Thus, the OCP level may end up being too high if the change in configuration results in lower power usage, or too low if the change in configuration results in increased power usage. As noted above, having too high an OCP level results in too large of an OCP gap, which increases the risk of damage from shorts. Having too low of an OCP level may result in increased chance of false-positive triggering of the OCP, as normal power usage may rise above the OCP threshold.

In contrast, in the examples disclosed herein, when such changes in the configuration of the system occur while the system is running, the OCP level is dynamically adjusted to reflect the power needs of the new configuration. Thus, the OCP level is always at an acceptable setting—not too high, not too low—relative to the current power needs of the system. Thus, in the examples disclosed herein the OCP level can track with the expected power usage of the system regardless of configuration changes, thereby keeping the OCP gap low at all times while avoiding false-positive triggering of the OCP.

The examples described herein may also be contrasted with a second alternative approach in which the OCP level of a PSU is changed dynamically, but based solely on the number of devices (e.g., server blades) installed in the system. Under this approach, the OCP level of the PSU may simply be incremented by a fixed amount each time that a new device is installed, or decremented by a fixed amount each time that a device is uninstalled. This approach may mitigate some of the difficulties with OCP protection that were noted above, as it may enable the OCP level to remain closer to the actual power needs of the system.

However, a potential drawback of the second alternative approach is that it does not consider the type of device that is installed in the system or the specific configuration of that device. This can result in the OCP level being set to a sub-optimal value. In particular, different types of computer modules will have different power needs, but these different power needs are not taken into account in the second alternative approach. The amount by which the OCP level is incremented is not based on the nature of the device being installed or its particular power needs, and thus may overshoot or undershoot the power needs of the device. To avoid false-positive OCP triggering, the second alternative approach may have to set the amount by which the OCP level is incremented to a highest power need of any possible device, and therefore the OCP level may be much higher than it should be if lower power devices are installed in the system.

In contrast, in some examples disclosed herein, the OCP level is determined based on more than just the brute number of computer modules that are installed in the system. Instead, the OCP level may be determined based on the expected power usage of the system, which is determined based on the specific power needs of each computer module, which are determined based on the type of computer module and its specific configuration (e.g., which computing components are actually installed in the module). Thus, the OCP level that is determined may be much closer to the actual usage of the system. Moreover, in examples disclosed herein, the OCP level may be changed when the configuration of an individual computer module changes, not just when a new module is installed or a module is uninstalled. For example, if new storage drives are hot-plugged into an already installed storage module, the power needs of that module will increase, and therefore a new OCP level may be determined to reflect this change in configuration.

Detailed examples of the aforementioned techniques and devices will now be described with reference to the Figures.

1. Example Computing System

Figure 2:
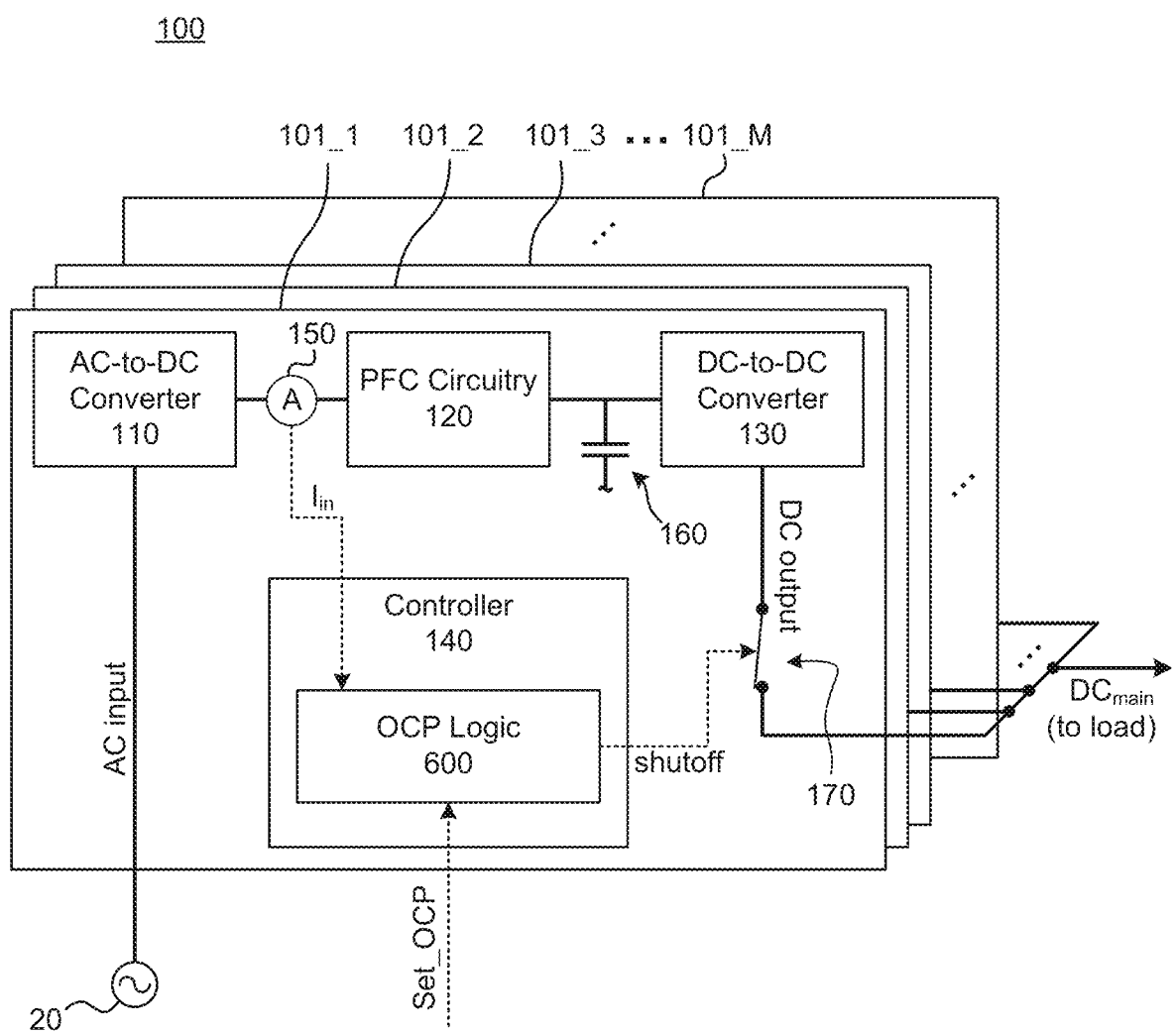
FIG. 2 is a block diagram illustrating an example power subsystem of the computing system.

FIG. 1 illustrates an example computing system 10. The computing system 10 is capable of having multiple computer modules 400 installed therein, and includes a power subsystem 100 to provide power to the computer modules 400, a backplane 200 to connect the computer modules 400 to the power subsystem 100, and a system controller 300 to control the system 10. In FIGS. 1 and 2, power signals are illustrated using solid lines, while communications and/or control signals are illustrated using dashed lines. In FIGS. 1 and 2, only half of the wiring path for the power signals is illustrated to simplify the diagram, but it should be understood that there would also be return paths (not illustrated) to complete the circuit.

The computer modules 400 may be any type of electronic device that is configured to be connected into the system 10 in a modular form. The computer modules 400 may be installed in the system 10 in corresponding installation locations, which are referred to herein as computer module bays 410. Each computer module bay 410 may include a slot that is sized and shaped to receive one of the computer modules 400. The computer module bays 410 may also include electrical connectors (e.g., power connector 201 and signal connector 202) to connect to the computer modules 400 when they are installed therein. The computer modules bays 410 may also include guidance and alignment mechanisms (such as rails, grooves, flanges, etc.) to engage with the computer modules 400 as they are inserted into the computer modules bays 410 and guide the computer modules 400 into an installed position.

A variety of different types of electronic devices may serve as the computer modules 400, and in some examples different types of computer modules 400 may be mixed and matched in the same system 10. For example, a first category of computer module 400 may include a device that is itself, or contains, a computer system (e.g., server). Examples of this type of computer module 400 include an individual blade server (aka "blade" or "server blade") of a blade system, an individual node of an HPC system, an individual node of a computer cluster, etc.

As another example, a second category of computer module 400 may include a device that has components to provide one or more IT functionalities or resources, but which is not itself a full computer system. The functionalities (resources) of such computer models 400 might be combined or "composed" together to form one or more computing systems. For example, in a composable computing system such as the HPE Synergy system, multiple different types of computer modules 400 may be included in the system to provide different computer functionalities, and a system controller may use software defined intelligence to compose the hardware resources of the computer modules 400 to form computing systems therefrom as needed. Examples of different types of computer modules 400 falling under this second category include compute modules 400a, memory modules 400b, accelerator modules 400c, storage modules 400d, networking modules 400e, cooling modules 400f, and the like. Compute modules 400a may include one or more processors on a printed circuit board ("PCB") to provide processing functionalities. The memory modules 400b may include a number of memory cards (e.g., DIMMs), which may include volatile and/or non-volatile memory, installed on a PCB. The memory cards of a memory module 400b may provide memory functionalities (e.g., the memory may be used as main memory for one or more computing systems). The accelerator modules 400c may include hardware accelerators such as ASICs, CPLDs, FPGAs, etc., to provide a variety of acceleration functionalities. The storage modules 400d may contain storage devices such as hard disk drives (HDD), solid-state drives (SSD), or other storage devices, to provide data storage functionalities. The networking modules 400e may include networking devices, such as fabric modules, switches, etc., to provide networking functionalities. The cooling modules 400f may include one or more cooling devices, such as fans, liquid cooling pumps, etc., to provide cooling to the other computer modules 400 installed in the system 10.

Any number of computer modules bays 410 may be included in the system 10 (FIG. 1 illustrates N computer module bays, where N is an integer greater than 3). When computer modules 400 are installed in the system 10, they become part of the system 10, but in some examples the system 10 might not include any computer modules 400 if none have been installed yet. In the system illustrated in FIG. 1, all N of the computer module bays 410 have a corresponding computer module 400 installed therein, but this is merely one example for purposes of illustration.

The power subsystem 100 includes one or more power supplies 101 (see FIG. 2), which provide a shared power pool to the computer modules 400. The subsystem 100 is described in greater detail in section 1.1 below.

The backplane 200 may provide DC power from the power subsystem 100 to the computer modules 400. For example, the backplane 200 may include a printed circuit board with power connectors 201 that are arranged to mate with corresponding connectors of the computer modules 400 as the computer modules 400 are inserted into a bay 410. In some examples, the power connectors 201 may be hot-plug power connectors, enabling the computer modules 400 to be hot-plug installed in and/or hot-plug removed from the bays 410.

In some examples, the backplane 200 may, in addition to distributing power to the computer modules 400, provide signal interconnections that connect the computer modules 400 to one another and/or to the system controller 300. For example, the backplane 200 may include a printed circuit board with signal connectors 202 that are arranged to mate with corresponding connectors of the computer modules 400 as the computer modules 400 are inserted into a bay 410. In some examples, the signal connectors 202 may be hot-plug signal connectors, enabling the computer modules 400 to be hot-plug installed in and/or hot-plug removed from the bays 410. In some examples, the signal connector 202 and power connector 201 are parts of the same larger connector.

Although the term "backplane" may sometimes be used to refer specifically to a PCB-based interconnection, as used herein "backplane" refers generally to any subsystem that provides power and/or signal interconnections, which may include, but does not necessarily have to include, a PCB. For example, the backplane 200 could be formed from a collection of power cables and/or signal cables that interconnect the various components of the system 10. In addition, the term "backplane" should not be interpreted as implying anything about the location, physical or logical, of the interconnections within the system 10, and thus as used herein the "backplane" could also be called a "midplane" or "frontplane" or the like. Although only one backplane 200 is illustrated in FIG. 1, in practice there could be multiple distinct backplanes 200 that provide power and/or signal interconnections for the computer modules 400 (for example, there could be a power backplane to provide power to the computer modules 400 and a separate signal backplane to provide signal interconnections).

The controller 300 includes one or more processors and/or dedicated hardware, which are configured to perform the operations described herein, such as the operations of processes 1000 that are described below with reference to FIGS. 3-4. In some examples, the controller 300 may be a controller of the system 10 that controls other operations of the system 10 besides those described herein, such as a chassis controller, cluster manager, frame link manager etc. However, such other operations are outside the scope of this disclosure, and thus are not described in detail herein. In other examples, the controller 300 may be a special purpose controller that is provided specifically for the dynamic OCP adjustment operations described herein. In either case, the controller 300 may include dynamic OCP adjustment logic 500, which is responsible for controlling performance of the dynamic OCP adjustment operations described herein. The dynamic OCP adjustment logic 500 is described in greater detail in section 1.2 below.

1.1 Example Power Subsystem 100

The example power subsystem 100 will now be described with primary reference to FIG. 2 (see also FIG. 1). The power subsystem 100 comprises one or more power supply units 101 (aka PSU 101 or power supply 101). The power supplies 101 of the power subsystem 100 are each configured to convert an input power signal into a DC power signal that is suitable for powering the computer modules 400. The power subsystem 100 also may provide power to the system controller 300.

When multiple PSUs 101 are included in the power subsystem 100, they may pool their output power. Specifically, the DC output power signals of the PSUs 101 may be combined into a common power source $DC_{main}$ for the computer modules 400. Thus, for example, a total power capacity of the power subsystem 100 may be the sum of the individual power capacities of the PSUs 101. In FIG. 2, M power supplies are illustrated, but for simplicity the internal details of only one PSU 101 are shown.

Although only one power signal from the power subsystem 100 (i.e., $DC_{main}$) is shown in FIGS. 1 and 2 as being supplied to the computer modules 400, in practice there could be multiple power signals supplied to the computer modules 400, such as multiple distinct voltage rails (e.g., a 12V rail, a 5V rail, a 3V rail, etc.). Furthermore, the power subsystem 100 may also supply distinct power signals for the system controller 300, such as the management or standby power signal, $DC_{managment}$ illustrated in FIG. 1. In other examples, the same power signal may be provided to the system controller 300 and the computer modules 400.

In some examples, the power subsystem 100 may include a controller (not illustrated) that may orchestrate operations of the PSUs 101. The controller of the power subsystem 100 may be implemented using one of the controllers 140, or the controller 300, or a separate dedicated controller. In other examples, there is no distinct controller of the power subsystem 100, and the individual controllers 140 of the PSUs 101 may act independently of one another or coordinate their activities via a distributed decision making process.

The power subsystem 100 may also perform OCP by comparing a current to an OCP threshold, and enacting protective measures if the current exceeds the threshold. In some examples, OCP may be implemented at the level of the power subsystem 100 by comparing a system-wide OCP threshold parameter to the total current flowing through the entire power subsystem 100. This type of OCP may be referred to hereinafter as system-wide OCP. In some examples, OCP may be implemented at the level of the individual PSU 101 by comparing the individual current draw of each PSU 101 to a PSU-specific OCP threshold parameter. This type of OCP may be referred to hereinafter as PSU-specific OCP. In some examples, both system-wide OCP and PSU-specific OCP may be used, while in other examples one or the other is used.

The subsystem 100 may include OCP logic 600 to implement the OCP. The OCP logic 600 may be included in each controller 140 of the PSUs 101, in the controller of the power subsystem 100 (if there is one), or both.

An example implementation of the PSU 101 is described in greater detail in section 1.1.1 below. An example implementation of the OCP logic 600 is described in greater detail in section 1.1.2 below.

1.1.1 Example Power Supply (PSU) 101

FIG. 2 illustrates an example power supply 101. The example power supply 101 includes an AC-to-DC converter 110, PFC circuitry 120 (also referred to as "the PFC"), a DC-to-DC converter 130, and a controller 140. The power supply 101 may also include a bulk capacitor 160, a cut-off switch 170, and a current sensor 150.

The AC-to-DC converter 110 is configured to receive an input AC power signal from an AC power source 20, such as a power distribution unit and/or mains power supply line. The AC-to-DC converter 110 is configured to convert the input AC power signal into a DC power signal. There are numerous types of AC-to-DC converters, and any type could be used as the AC-to-DC converter 110. For example, the AC-to-DC converter 110 may include a bridge rectifier. The AC-to-DC converter 110 may also include additional components, such as a filter for filtering the input AC power signal, a capacitor to receive the converted power signal, etc.

The PFC 120 is configured to apply power factor correction to the power drawn by the power supply 101. In the illustrated example, the PFC 120 receives the signal that is output by the AC-to-DC converter 110, applies power factor correction, and outputs a corrected DC power signal to the DC-to-DC converter 130 (for example, via a bulk storage capacitor 160). The PFC 120 corrects the power factor by altering the waveform of the current that is drawn from the AC power source 20 ($I_{in}$) such that the current waveform is sinusoidal and the phase difference between $I_{in}$ and the voltage of the AC input signal ($V_{in}$) is zero (or as close as possible). For example, the PFC 120 may include a boost converter, and may alter the waveform of the current $I_{in}$ by modulating a duty cycle of a signal that controls a switch of the boost converter.

The DC-to-DC converter 130 may convert the signal output by the PFC circuitry 120 to a desired voltage for the electronic device, and supply the converted DC output signal to the electronic device. There are numerous types of DC-to-DC converters, and any type could be used as the DC-to-DC converter 130. For example, the DC-to-DC converter 130 may include a switch-mode DC-DC converter.

The current sensor 150 is to measure an amount of input current $I_{in}$ currently being drawn by the power supply 101 from the input power source 20, and provide that information to the controller 140. The current sensor 150 may sense the input current $I_{in}$ periodically, such as every clock cycle. In FIG. 2, the current sensor 150 is illustrated as being located between the AC-to-DC converter 110 and the PFC 120, but the current sensor 150 could be located anywhere in the power supply 101 that allows it to measure the current flowing through the power supply 101. Moreover, although the current sensor 150 is illustrated in FIG. 2 as being separate from the other components, the current sensor 150 could be an integral part of another component of the power supply 101, such as a part of the converter 110, the PFC circuitry 120, etc.

The controller 140 may be configured to perform operations described herein, such as the operations of processes 2000 that are described below with reference to FIG. 7. In some examples, the controller 140 may be implemented in a controller of the power supply 101 that also controls other operations of the power supply 101 besides the operations described herein, such as in a primary side controller or a secondary side controller (or both) in a dual-controller PSU 101. In other examples, the controller 140 may be a special purpose controller specifically for performing the operations described herein. In either case, the controller 140 may include OCP logic 600. The OCP logic 600 may include a processor that is to execute stored instructions to perform the operations described herein, dedicated hardware that is configured to perform the operations described herein, or any combination of these. The OCP logic 600 is described in greater detail below.

In FIG. 2, the PFC 120 is shown as being between the AC-to-DC converter 110 and the DC-DC converter 130, but this is just one possible configuration. In other examples, the PFC 120 may be located elsewhere in the power supply 101.

In FIG. 2, various components, such as filters, capacitors, transformers, correction circuitry, etc. are omitted to simplify the diagram. However, in practice any number of such components may be included in the power supply 101 in any configuration.

Although FIG. 2 may give the appearance that the controller 140 is collocated with the other components, this need not necessarily by the case. In some examples, the controller 140 may be contained within a same chassis or device housing as the other components of the power supply 101. For example, when the controller 140 is implemented as the main controller of the power supply 101, it may generally (although not of necessity) be located within the main chassis or device housing as the rest of power supply 101. However, in other examples the controller 140 may be located outside of the chassis or housing of the power supply 101, and may communicate with the rest of the power supply 101 via a communications interface. For example, in some cases in which the controller 140 is not part of the main controller of the power supply 101, the controller 140 may be housed within a different device housing, such as in a multi-node system management unit (e.g., rack management unit).

In some examples, each PSU 101 includes its own controller 140. In other examples, a single controller 140 may control all of the PSUs 101.

Although the example PSU 101 described above has an AC input signal, this is merely one example and the input power signal could be a DC power signal. If the input signal is a DC power signal, the power supply 101 may perform DC-to-DC conversion, rather than AC-to-DC conversion, to generate the output DC power signal having a suitable voltage for the load. In such a case, the AC-to-DC converter 110 could be omitted entirely, or could be replaced by a DC-to-DC converter.

It should be understood that there are numerous ways that a power supply may be configured to convert input power to DC output power, including configurations having different types and/or numbers of converters, as well as different supporting components such as filters, correction circuitry, transformers, etc. FIG. 2 illustrates one specific example of a power supply 101, but it should be understood that the techniques described herein for dynamic OCP threshold adjustment could be implemented using any other configuration of a power supply.

1.1.2 Example OCP Logic 600

As noted above, the OCP logic 600 may perform OCP, which may be system-wide OCP or PSU-specific OCP. Thus, the OCP logic 600 may maintain an OCP threshold parameter that it uses to implement OCP. The OCP threshold parameter may be a system-wide OCP parameter, or a PSU-specific OCP parameter. The current value of this parameter may be stored in a storage location, such as a register for example.

The OCP logic 600 may be configured to monitor (i.e., periodically measure) the current flowing through one of the PSUs 101 (in the case of PSU-specific OCP) or the aggregate current flowing through the entire power subsystem 100 (in the case of system-wide OCP). The OCP logic 600 may then compare the measured current to an OCP threshold parameter. If the measured current exceeds the OCP threshold parameter of interest, then the OCP logic 600 triggers protective measures.

The protective measures may include shutting down the flow of current through the power supply 101 or through the entire power subsystem 100. For example, the OCP logic 600 may send a shutoff signal to a switch 170, which breaks the circuit and ceases the flow of power. Although FIG. 2 illustrates one switch 170 that is located between the DC-to-DC converter 130 and the electronic device, this is merely an example and one or more switches 170 could be located anywhere in the flow path of the power signal to break the circuit. Furthermore, a switch 170 is just one possible way to shut down the supply of power, and any other method of shutting down the supply of power could be used. For example, one or both of the converters 110, 130 may be capable of shutting down the supply of power responsive to a command from the OCP logic 600.

The OCP logic 600 may monitor the current of interest using a current sensor, such as the current sensor 150. In the case of PSU-specific OCP, the current flowing through the PSU 101 could be monitored by measuring the input current $I_{in}$ that is flowing into the bulk capacitor 160, or by measuring the current that is flowing out of the PSU 101 in the DC output signal, or by measuring the current anywhere else within the PSU 101. In the case of system-wide OCP, the aggregate current could be determined by measuring individual currents in each PSU 101 and summing them, or by directly measuring a current flowing through a common power signal from the subsystem 101, such as $DC_{main}$.

In addition to performing OCP, the OCP logic 600 may also be configured to update its OCP parameter in response to an instruction from the system controller 300. Specifically, the OCP logic 600 may be configured to receive the instruction Set_OCP from the controller 300, and update an OCP threshold parameter in response to the instruction.

The instruction Set_OCP may specify a new system-wide OCP threshold value, a new PSU-specific OCP threshold value, or both. If the OCP logic 600 is performing system-wide OCP, then the OCP logic 600 updates the value of its system-wide OCP threshold parameter to equal the system-wide threshold value, which is specified in the instruction Set_OCP. If the OCP logic 600 is performing PSU-specific OCP, then the OCP logic 600 updates the value of its PSU-specific OCP threshold parameter to equal the new PSU-specific threshold value, which may be either (a) specified in the instruction Set_OCP, or (b) derived by the OCP logic 600 from the new system-wide OCP threshold value specified in the instruction Set_OCP.

When it is said herein (including in the claims) that the power subsystem 100 implements OCP based on an OCP threshold parameter, this should be understood broadly to encompass all of the possibilities noted above. In other words, when it is said that the subsystem 100 implements OCP, the OCP could be system-wide OCP or PSU-specific OCP, unless specifically indicated otherwise. Similarly, when it is said that OCP is based on an OCP threshold parameter, the OCP threshold parameter could be an aggregate system-wide OCP threshold parameter or a PSU-specific OCP threshold parameter, unless specifically indicated otherwise. Furthermore, system-wide and PSU-specific OCP can be provided together in the same power subsystem 100.

Figure 8:
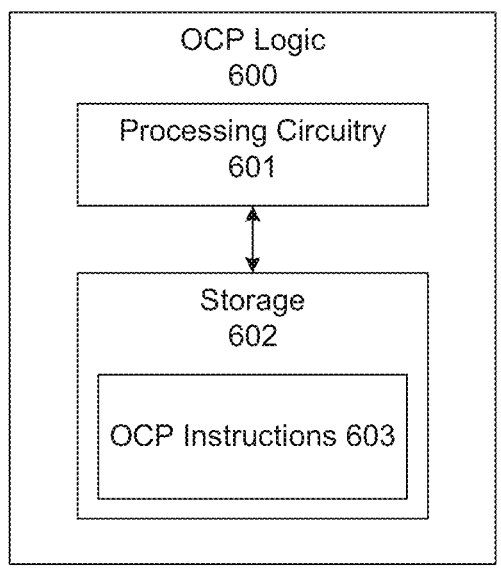
FIG. 8 is a block diagram illustrating example OCP logic.

FIG. 8 illustrates an example of the OCP logic 600. In some examples, multiple instances of the OCP logic 600 may be included within the same system 10—for example, each PSU 101 may include an instance of the OCP logic 600 as part of its controller 140 (see FIG. 2 as an example), which may perform PSU-specific OCP for that particular PSU. In addition, an instance of the OCP logic 600 may be included in the controller of the power subsystem 100 (if there is one).

The OCP logic 600 includes processing circuitry 601 that is configured to the perform operations described herein. The processing circuitry 601 includes a number of processors that are configured to perform one or more operations described herein, dedicated hardware that is configured to perform one or more operations described herein, or any combination of these. When the processing circuitry includes a processor, it may also include storage 602 storing OCP instructions 603 that may be executed by the processor.

Thus, when it is said herein that the OCP logic 600 is configured to perform an operation, this means that either (a) there is an instruction stored in the storage 602 that, when executed by a processor of the processing circuitry 601, will cause the processing circuitry 601 to perform the operation, (b) there is detected hardware in the processing circuitry 601 that is configured to perform the operation, or (c) some combination of (a) and (b).

As used herein, a "processor" may include (or be virtualized from) any circuitry that is capable of executing machine-readable instructions, such as central processing units (CPUs), graphic processing units (GPUs), a system-on-chip (SoC), microprocessors, microcontrollers, digital signal processors (DSPs), application-specific instruction set processors (ASIPs), etc. As used herein, "dedicated hardware" means any physical device or component that is configured to perform a specific operation or set of operations (although not necessarily dependent on executing instructions), such as application-specific integrated circuits (ASICs), complex programmable logic devices (CPLD), field-programmable gate arrays (FPGAs), and so on. There is not necessarily a sharp line between processor and dedicated hardware, and some devices (such as FPGAs) could arguably fall under either category.

The storage 602 may include any non-transitory machine readable medium, which may include volatile storage media (e.g., DRAM, SRAM, etc.) and/or non-volatile storage media (e.g., PROM, EPROM, EEPROM, NVRAM, flash, hard drives, optical disks, etc.).

1.2 Example Dynamic OCP Adjustment Logic 500

The dynamic OCP adjustment logic 500 may be configured to monitor (i.e., repeatedly determine) the expected power requirements of the system 10 during normal operation of the system 10, and update the OCP threshold as needed based on the expected power requirements. This is in contrast to setting the OCP threshold only in association with turning on the system 10, shutting down the system 10, initializing the system 10, manually reprogramming of the system 10, or the like. Because the expected power requirements are determined dynamically based on the current state of the system 10, as the system 10 changes the OCP threshold may be updated to better track the actual power usage of the system 10 rather than remaining fixed at a potentially sub-optimal level. This may be especially beneficial in systems that can have their configuration and/or power requirements changed during operation, such as a system 10 in which computer modules 400 may be hot-plugged or hot-unplugged from the system 10 or in which components may be added to or removed from individual computer modules 400.

The updating of the OCP level may be done periodically at specified time intervals, or may be done occasionally (episodically) in response to the expected power needs of the system 10 changing. For example, the dynamic OCP adjustment logic 500 may monitor for changes in the system, such as computer modules 400 being added or removed or changes in the configuration of individual computer modules 400, and may determine a new OCP setting in response to detecting a change in configuration. As another example, the controller may determine a new OCP setting in response to a new job being scheduled, or an existing job being completed.

Note that, in some examples, the new OCP is determined based on more than just the number of computer modules installed in the system. In particular, the OCP may be determined based on the specific nature and configuration of each computer module, including, for example, its actual configuration of CPU, memory, storage, networking, etc. Thus, the expected power usage may be much more accurately estimated. Moreover, the OCP may be changed when the configurations of the computer modules change, even if the total number of computer modules does not change. For example, if new memory DIMMs are installed in a computer module, the power allocated to that module may need to be increased, potentially resulting in a new OCP set-point being determined.

The determining of the expected power requirements of the system is described in greater detail below in section 1.2.1. The updating of the OCP threshold based on the expected power requirements of the system is described in greater detail below in section 1.2.2.

1.2.1 Determining Expected Power Requirements

The current state of the system 10 that is used to determine the expected power requirements may take into account the different types of computer modules 400 that are currently installed in the system and their varying power needs. That is, the dynamic OCP adjustment logic 500 may identify which specific computer modules 400 are installed in the system 10, and determine the expected power requirements of the system 10 based on the identities of each computer modules 400 (i.e., based on which types of modules 400 are installed). For example, the dynamic OCP adjustment logic 500 may determine an expected power need (aka "power allocation") for each of the computer modules 400 based on the type of module 400 it is, and may sum the individual power needs to obtain the expected power requirements for the system 10.

The dynamic OCP adjustment logic 500 may determine the individual power needs of a given computer module 400 by, for example, searching a database based on the particular identity of the given computer module 400, where the database associates estimates of power requirements with specific types of computer modules 400. Such a database may be compiled in advance by testing or modeling the power needs of a variety of computer modules 400 that could be installed in the system 10.

Furthermore, in some examples the determination of the expected power requirements may take into account the component-level configurations of each computer module 400. That is, the dynamic OCP adjustment logic 500 may identify the specific configuration of each computer module 400 installed in the system 10, and determine the expected power requirements of the system 10 based on the configurations of the computer modules 400. As used herein, the "configuration" of a computer module 400 refers to the specific combination of computer components that are installed in the computer module 400, where computer components include things such as processors (e.g., CPUs, GPUs, etc.), memory cards (DIMMs), accelerators, integrated circuits (e.g., networking IC's), controllers (e.g., baseboard management controllers (BMC), RAID controllers, etc.), storage drives, fans, pumps, etc. For example, one computer module 400 may have two processors and six memory DIMMs, while another computer module 400 may have four processors and 16 memory DIMMs, while another computer module 400 may have no processors and 32 memory DIMMs, while another computer module 400 may have 20 HDDs, while another computer modules 400 may have 12 SSDs, and so on. All of these differences in configuration mean that one computer module 400 may have a different expected power need than another computer module 400. Thus, by taking the specific configurations of the modules 400 into account when determining the power requirements for the system 10, a more accurate estimate of the power requirement (i.e., one that is closer to the actual power usage) may be obtained. The system controller 300 may discover the configuration of each computer module 400 for example by communicating with the computer modules 400 via the backplane 200. Such discovery may occur the computer module 400 is installed and/or powered on, periodically, or episodically in response to changes in configuration.

The dynamic OCP adjustment logic 500 may determine the individual power needs of a given computer module 400 by, for example, searching a database based on the particular configuration of the given computer module 400, where the database associates estimates of power requirements with specific configurations of specific types of computer modules 400. For example, if the given computer module 400 is an HPC node that has two processors and twelve DIMMs installed in it, then the database may be searched based on "two-processor, twelve DIMM, HPC node" and the power need listed in the corresponding entry in the database may be used as the estimated power need of the given computer module 400. Such a database may be compiled in advance by testing or modeling the power needs of a variety of likely configurations of a variety of computer modules 400 that could be installed in the system 10.

As another example, the dynamic OCP adjustment logic 500 may determine the individual power needs of a given computer module 400 by determining power needs of each individual component (e.g., processor, memory card, etc.) of the given computer module 400, and summing the individual power needs of each component to obtain the power needs of the given computer module 400. For example, if the given computer module 400 is an HPC node that has two processors and twelve DIMMs installed in it, then the database may be searched once to find the power need of the processor ($P_{processor}$) and once to find the power need of the DIMM ($P_{DIMM}$), and then the total power need for the computer module 400 may be calculated as $2 \cdot P_{processor} + 12 \cdot P_{DIMM}$. The power needs of each component may be determined by searching a database based on the identity of the component. Such a database may be compiled in advance by testing or modeling the power needs of a variety of components that could be installed in a computer module 400.

It may be noted that there are different levels of generality at which the configuration of a computer module 400 may be described. For example, at a more generic level, one could identify the types of components in the computer module 400 using broad categories, such as "processors" and "DIMMs". At a slightly narrower level, one could more specifically identify the components, such as by specifying a product family or component sub-category, such as "Intel Xenon processors" or "NVMe SSD". At a still narrower level, one could specify specific products, model numbers, SKUs, or performance metrics of the components, such as "Intel Xenon Processor E7-8890 v2" or "DDR5 RAM at 2600 HMz at 1.1V". Different example systems 10 may identify the types of computer components at different levels of generality for purposes of determining the power requirements of the system. The more narrowly the components are specified, the more accurate the power estimate for the computer module 400 will be, but the more complicated the compiling of the component power requirements will be. For purposes of this disclosure, the configuration of the computer modules 400 should be considered as specifying at least the broad category of the component, such as processor, memory card, GPU, storage drive, network IC, fan, pump, etc., unless a more specific identification is noted.

In some examples, the estimated power need (power allocation) for a computer module 400 may correspond to a highest amount of current that the computer module 400 as currently configured is expected to draw when fully loaded and operating normally (i.e., without a short or other fault). Thus, the actual instantaneous power draw of the computer module is not always going to be equal to the power allocation of the module 400 (the actual usage will usually be less than the power allocation). Similarly, the actual instantaneous power draw of the entire system 10 is not always going to be equal to the determined power requirement for the system 10 (the actual usage will usually be less than the determined power requirement).

In addition, in some examples the dynamic OCP adjustment logic 500 may take into account expected workload of the computing modules 400, and use this information to further refine the expected power requirements. For example, in some HPC computing systems there is a job scheduler that assigns jobs to nodes, and thus the computing system may be aware of which nodes are being heavily loaded and which nodes are being lightly loaded (or not loaded at all), and may estimate the power allocation of each node accordingly. For example, for a node that is executing a job, or is about to be assigned a job, the power allocation for that node may be set to a maximum expected power draw of that computing module, while for a node that is not executing a job the power allocation may be set to a lower value (e.g., 50% of the maximum expected power draw).

1.2.2 OCP Threshold Updating

The dynamic OCP adjustment logic 500 may repeatedly determine new OCP threshold values based on the expected power requirements of the system 10. This may be done periodically at fixed intervals, or it may be done occasionally in response to an event (e.g., the addition/removal of a computer module 400 or the changing of the configuration of a computer module 400).

In some examples, the OCP adjustment logic 500 may set the OCP threshold to be equal to the determined power requirement of the computing system 10. In other examples, the OCP adjustment logic 500 may set the OCP threshold to be a little higher than the determined power requirement of the computing system 10. The setting of the OCP threshold higher than the power requirements may take into account requirements of the system 10 such as operational margin, fault tolerance, power redundancy and PSU power sharing inaccuracies. For example, the OCP threshold may be set to be a specified amount (e.g., 10A) higher than the determined power requirement. As another example, the OCP threshold may be set to be proportional to (e.g., 10% higher than) the determined power requirement by a specified proportionality constant. The specified amount or the specified proportionality constant may be, for example, fixed, programmable (configurable), or dynamically calculated.

Upon determining a new OCP threshold value, the dynamic OCP adjustment logic 500 may send an instruction Set_OCP to the power subsystem 100 instructing it to change the value(s) of its OCP threshold parameter(s) based on the new OCP threshold value.

Note that the OCP threshold that is determined by the OCP adjustment logic 500 is generally a system-wide OCP threshold value, as opposed to being a PSU-specific OCP threshold value (unless there is only one PSU 101, in which case system-wide and PSU-specific OCP thresholds would be the same). In other words, the OCP threshold that is determined by the OCP adjustment logic 500 represents a maximum total current that should be allowed to flow through the entire power subsystem 100, rather than a maximum current that should be allowed to flow through an individual PSU 101. Thus, in examples in which the subsystem 100 implements PSU-specific OCP, the system-wide OCP threshold value that is determined by the dynamic OCP adjustment logic 500 may be translated into PSU-specific OCP threshold values for each individual PSU 101. When PSU-specific OCP values are needed, they may be obtained by dividing the system-wide OCP threshold value by the number of active PSUs 101. The translation of the system-wide OCP threshold value into PSU-specific OCP threshold values may be done by the dynamic OCP adjustment logic 500, or by the power subsystem 100.

Thus, in some examples the Set_OCP instruction may specify the system-wide OCP threshold value, in which case the subsystem 100 may determine the PSU-specific OCP threshold values based on the system-wide OCP threshold value. In other examples, the Set_OCP instruction may specify the PSU-specific OCP threshold value (in addition to or in lieu of the system-wide OCP threshold value).

In some circumstances, it may be desirable to establish a minimum value below which the OCP threshold will not drop. That is, even if the determined power requirement drops below the minimum value, the OCP adjustment logic 500 does not lower the OCP threshold below the minimum value. The reason why this may be desirable in some circumstances is that at very low power utilizations in multi-PSU systems, the PSUs may stop sharing the power load evenly. Evenly sharing the load means that the PSUs all supply approximately equal amounts of current to support the load, with the amount of current being roughly equal to $I_{total}/M$, where $I_{total}$ is the total current being supplied by all the PSUs and M is the number of PSUs. Such even sharing of the power load usually occurs during moderate or high power utilization. However, at low utilization levels, the balancing of the load may break down such that one power supply may end up supplying significantly more current than its proportional share $I_{total}/M$ Because the PSU-specific OCP threshold of the PSU is set at a level that assumes equal current sharing, when one of the PSUs is supplying more than its proportional share of the current the OCP threshold may be reached even if there is no short or other fault, resulting in a false-positive OCP triggering. Thus, when utilization is low, the risk of false-positive OCP triggering increases. The inventors conducted a series of experiments and found that, in one example multi-PSU system, current sharing started to become unbalanced (i.e., one or more PSUs started supplying more than its proportional share of current) at utilization levels below 20% of capacity. Thus it was determined that, in the example system, the minimum value for the system-wide OCP threshold may advantageously be set to 25% of the capacity.

The utilization level at which the current sharing breaks down will depend on the specific system in question, since different PSU's may be differently configured. Thus, the minimum OCP value noted above is merely an example, and other minimum OCP values may be preferred for other systems. The utilization level at which current sharing breaks down for a particular system can be determined experimentally by: applying a load to the power subsystem; varying the load to test multiple different total current levels ($I_{total\_1}$, $I_{total\_2}$, . . . ); for each of the total current levels ($I_{total\_1}$, $I_{total\_2}$, . . . ), measuring the individual current being supplied by each individual PSU; and identifying at which total current levels ($I_{total\_1}$, $I_{total\_2}$, . . . ) one or more of the PSUs begins to supply an individual current that deviates from $I_{total}/M$ by more than a specified amount (e.g., 5%). The identified total current level may be referred to as the "breakdown level". The minimum OCP value may then be set to equal or exceed the breakdown level by any desired amount. For example, the same formula that is used to determine a new OCP threshold based on an expected power requirement may be used to determine the minimum OCP value, with the breakdown level being substituted for the expected power requirement. For example, if the OCP threshold is set to exceed the expected power requirement by a fixed amount, then the minimum OCP value may be set to exceed the breakdown level by the same fixed amount.

The dynamic OCP adjustment logic 500 may be formed from a processor that is to execute stored instructions to perform one or more of the operations described herein, dedicated hardware that is configured to perform one or more of the operations described herein, or any combination of these.

Figure 5:
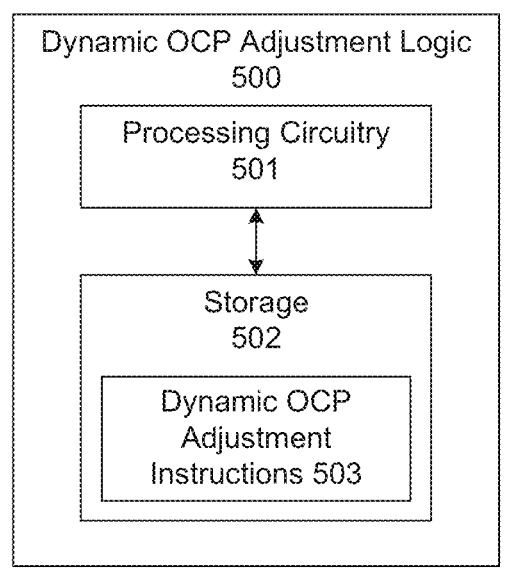
FIG. 5 is a block diagram illustrating example dynamic OCP adjustment logic.

More specifically FIG. 5 illustrates an example of the dynamic OCP adjustment logic 500, which includes processing circuitry 501 that is configured to the perform operations described herein. The processing circuitry 501 includes a number of processors that are configured to perform one or more operations described herein, dedicated hardware that is configured to perform one or more operations described herein, or any combination of these. When the processing circuitry includes a processor, the logic 500 may also include storage 502 storing dynamic OCP adjustment instructions 503 that may be executed by the processor.

Thus, when it is said that the dynamic OCP adjustment Logic 500 is configured to perform an operation, this means that either (a) there is an instruction stored in the storage 502 that, when executed by a processor of the processing circuitry 501, will cause the processing circuitry 501 to perform the operation, (b) there is detected hardware in the processing circuitry 501 that is configured to perform the operation, or (c) some combination of (a) and (b).

As used herein, a "processor" may include (or be virtualized from) any circuitry that is capable of executing machine-readable instructions, such as central processing units (CPUs), graphic processing units (GPUs), a system-on-chip (SoC), microprocessors, microcontrollers, digital signal processors (DSPs), application-specific instruction set processors (ASIPs), etc. As used herein, "dedicated hardware" means any physical device or component that is configured to perform a specific operation or set of operations (although not necessarily dependent on executing instructions), such as application-specific integrated circuits (ASICs), complex programmable logic devices (CPLD), field-programmable gate arrays (FPGAs), and so on. There is not necessarily a sharp line between processor and dedicated hardware, and some devices (such as FPGAs) could arguably fall under either category.

The storage 502 may include any non-transitory machine readable medium, which may include volatile storage media (e.g., DRAM, SRAM, etc.) and/or non-volatile storage media (e.g., PROM, EPROM, EEPROM, NVRAM, flash, hard drives, optical disks, etc.).

2. Example Dynamic OCP Adjustment Process 1000 and Instructions 503

Figure 3:
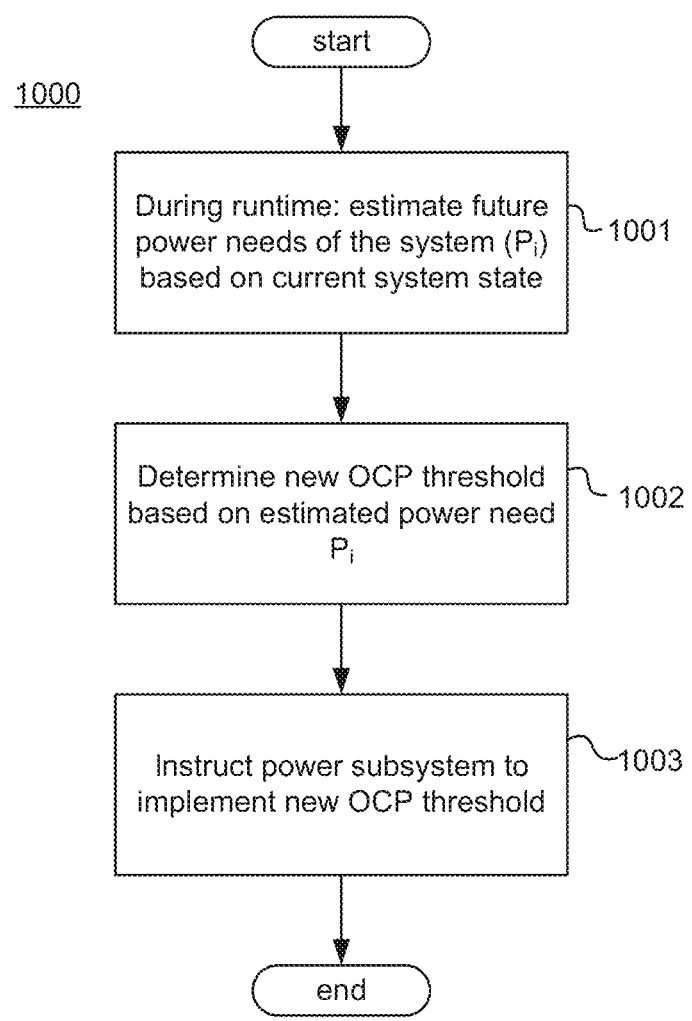
FIG. 3 is a process flow diagram illustrating an example process of dynamically adjusting an overcurrent protection (OCP) threshold of a power supply based on current system state.

FIG. 3 illustrates an example method for dynamically updating the OCP threshold of a power subsystem of a computing system. The method may be performed by a system controller of the computing system, such as the controller 300 described above.

At block 1001, the controller estimates future power needs of the system based on the current state of the system. This is done during normal operation (runtime) of the system, as opposed to merely at startup or shutdown or the like. The estimation of future power needs may include operations such as those described above in section 1.2.1 in relation to determining the expected power requirements of the system 10. The current state of the system, upon which the estimated power needs are based, may include the component-level configuration of each computer module installed in the system. The current state of the system may also include, for example, workloads being executed, or planned to be executed, by the computer modules.

At block 1002, during normal operation of the system, the controller determines a new OCP threshold value based on the estimated power need of the system. For example, the new OCP threshold value may be equal to, or slightly higher than, the estimated power need. The determination of the new OCP threshold value may include operations such as those described above in section 1.2.2.

At block 1003, the controller instructs the power subsystem to implement the new OCP threshold. The process then ends.

The process 1000 may be repeated multiple times during normal operation of the system. For example, the process 1000 may be performed periodically at set intervals. As another example, process 1000 may be performed in response to changes in the configuration of the system.

Figure 4:
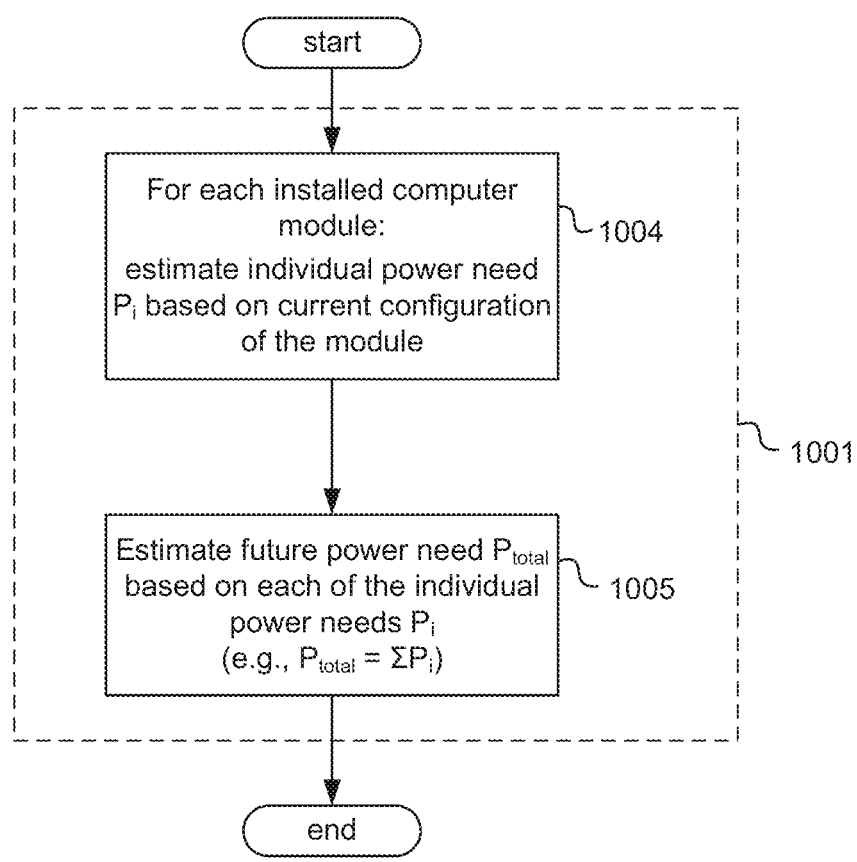
FIG. 4 is a process flow diagram illustrating an example process of determining an estimated future power need of the system.

FIG. 4 (described in greater detail below) illustrates one example of how the estimation of block 1001 may be performed.

In block 1004, for each of the installed computer modules, the controller estimates an individual power need $P_i$, where i is an index to identify a particular computer module. The individual power need $P_i$ of the $i^{th}$ computer module is determined based on the current configuration of that module, including the specific type of module that it is and its installed computer components. For example, the individual power need $P_i$ of the $i^{th}$ computer module may be determined based on the specific combination of computer components that are installed in the computer module.

In block 1005, the controller estimates the future power need of the entire system, $P_{total}$, based on each of the individual power needs $P_i$. In particular, the controller may sum the individual power needs $P_i$ to obtain $P_{total}$.

Figure 6:
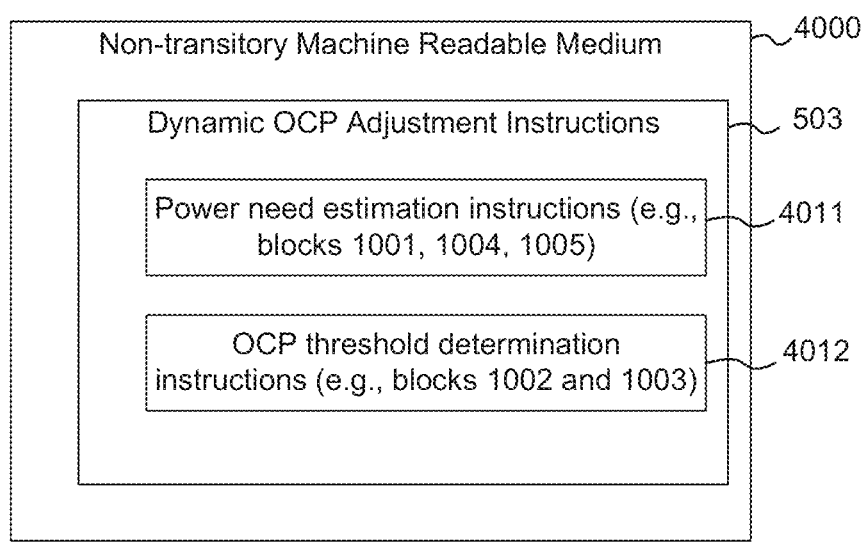
FIG. 6 is a block diagram illustrating an example non-transitory machine readable medium storing example dynamic OCP adjustment instructions.

FIG. 6 illustrates an example non-transitory machine readable medium 4000 storing example dynamic OCP adjustment instructions 503.

The example non-transitory machine readable medium 4000 may include any non-transitory machine readable medium, which may include volatile storage media (e.g., DRAM, SRAM, etc.) and/or non-volatile storage media (e.g., PROM, EPROM, EEPROM, NVRAM, flash, hard drives, optical disks, etc.).

The example dynamic OCP adjustment instructions 503 may include machine readable, processor executable, instructions that are to, when executed by a processor, cause the processor to perform some or all of the operations of the process 1000 (FIGS. 3 and 4), operations described in section 1.1.1 above, and/or operations described in section 1.2.2 above.

For example, the dynamic OCP adjustment instructions 503 may include power need estimation instructions 4011. These may include instructions to perform the operations of block 1001 of the process 1000 (which may include the operations of blocks 1004 and 1005), and/or instructions to perform any of the operations described in section 1.2.1 above.

The dynamic OCP adjustment instructions 503 may also include OCP threshold determination instructions 4011. These may include instructions to perform the operations of blocks 1002 and 1003 of the process 1000, and/or instructions to perform any of the operations described in section 1.2.2 above.

3. Example OCP Adjusting Process 2000 and OCP Instructions 603

Figure 7:
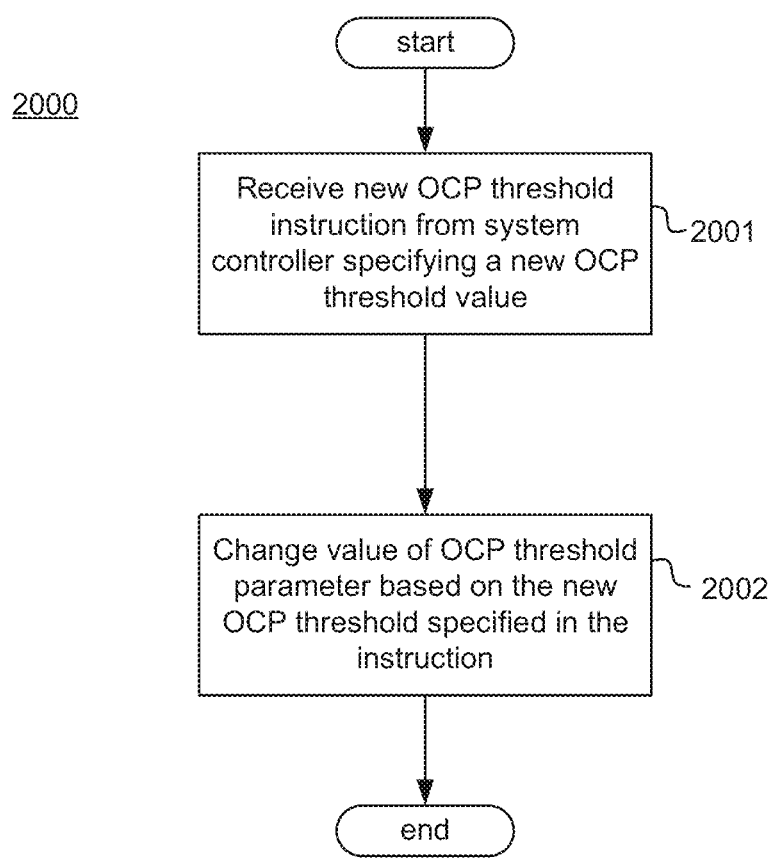
FIG. 7 is a process flow diagram illustrating an example process of adjusting the OCP threshold of a power supply.

FIG. 7 illustrates an example method for changing the OCP threshold of a power subsystem of a computing system, based on a new OCP threshold that has been determined by the system. The method may be performed by a controller of a PSU the power subsystem, such as the controller 140 described above, or by a controller of the power subsystem.

At block 2001, during normal operation of the system, the controller receives a new OCP threshold instruction (e.g., Set_OCP) from a system controller of the computing system. The new OCP threshold instruction includes an indication of a new OCP threshold value, which may be a system-wide OCP threshold value or a PSU-specific threshold value.

At block 2002, in response to receiving the new OCP threshold instruction, the controller changes the value of an OCP threshold parameter based on the new OCP threshold value specified in the instruction. The changing of the parameter is done during normal operation of the system. The OCP threshold parameter whose value is changed may be a PSU-specific OCP threshold parameter of a PSU, or a system-wide OCP threshold parameter of the entire power subsystem. If the new OCP threshold value specified in the instruction is a system-wide OCP threshold and the OCP threshold parameter that is to be changed is a PSU-specific threshold, the controller may convert the system-wide OCP threshold into a PSU-specific threshold, as described above.

Figure 9:
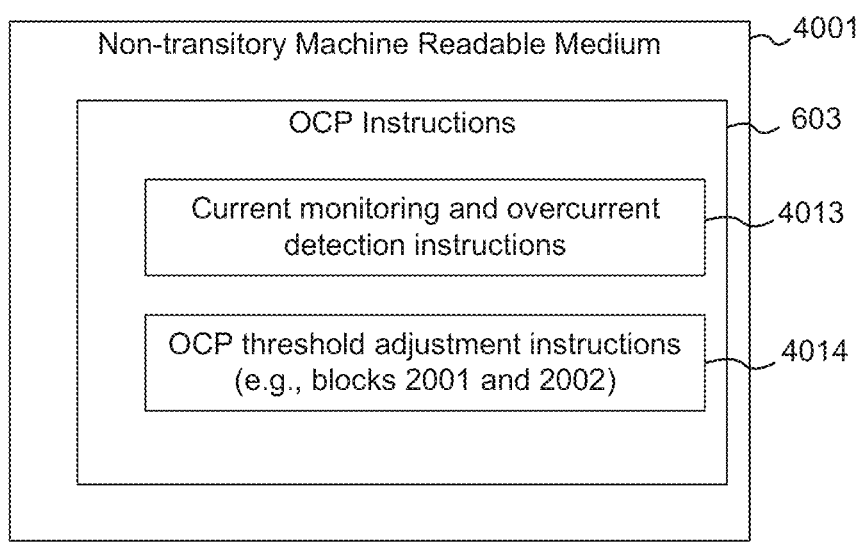
FIG. 9 is a block diagram illustrating an example non-transitory machine readable medium storing example OCP instructions.

FIG. 9 illustrates an example non-transitory machine readable medium 4001 storing example OCP instructions 603.

The example non-transitory machine readable medium 4001 may include any non-transitory machine readable medium, which may include volatile storage media (e.g., DRAM, SRAM, etc.) and/or non-volatile storage media (e.g., PROM, EPROM, EEPROM, NVRAM, flash, hard drives, optical disks, etc.).

The example OCP instructions 603 may include machine readable, processor executable, instructions that are to, when executed by a processor, cause the processor to perform some or all of the operations of the process 2000, the operations described herein in section 1.1.2 above, and/or any of the operations related to performing OCP described above.

For example, the OCP instructions 603 may include current monitoring and overcurrent detection instructions 4013. These may include instructions to perform OCP (monitor current and compare to an OCP threshold), as described above.

The OCP instructions 603 may include OCP threshold adjustment instructions 4014. These may include instructions to perform the operations of the process 2000 and/or the operations described herein in section 1.1.2 above.

4. Definitions

As used herein, a "processor" may include any logic circuitry that is capable of executing machine readable instructions stored in a non-transitory machine-readable medium. For example, a "processor" may be, for example, a central processing unit (CPU), a microprocessor, a microcontroller, a digital signal processor (DSP), a graphic processing unit (GPU), etc.

Throughout this disclosure and in the appended claims, occasionally reference may be made to "a number" of items. Such references to "a number" mean any integer greater than or equal to one. When "a number" is used in this way, the word describing the item(s) may be written in pluralized form for grammatical consistency, but this does not necessarily mean that multiple items are being referred to. Thus, for example, a phrase such as "a number of processors, wherein the processors . . . " could encompass both one processor and multiple processors, notwithstanding the use of the pluralized form.

The fact that the phrase "a number" may be used in referring to some items should not be interpreted to mean that omission of the phrase "a number" when referring to another item means that the item is necessarily singular or necessarily plural.

In particular, when items are referred to using the articles "a", "an", and "the" without any explicit indication of singularity or multiplicity, this should be understood to mean that there is "at least one" of the item, unless explicitly stated otherwise. When these articles are used in this way, the word describing the item(s) may be written in singular form for grammatical consistency, but this does not necessarily mean that only one item is being referred to. Thus, for example, a phrase such as "a processor, wherein the processor . . . " could encompass both one processor and multiple processors, notwithstanding the use of the singular form.

Occasionally the phrase "and/or" is used herein in conjunction with a list of items. This phrase means that any combination of items in the list—from a single item to all of the items and any permutation in between—may be included. Thus, for example, "A, B, and/or C" means "one of {A}, {B}, {C}, {A, B}, {A, C}, {C, B}, and {A, C, B}".

While the above disclosure has been shown and described with reference to the foregoing examples, it should be understood that other forms, details, and implementations may be made without departing from the spirit and scope of this disclosure.

What is claimed is:

1. A computing system, comprising:
computer module bays;
a power subsystem configured to:
supply power to a plurality of computer modules installed in the computer module bays and to implement overcurrent protection (OCP) based on an OCP threshold parameter;
a system controller configured to, during normal operation of the computing system, periodically:
determine respective job assignments by a job scheduler to the computer modules of the computing system;
determine respective power requirements for the computer modules by, for each computer module:
determining an estimated maximum power demand of the computer module based on a current configuration of the computer module;
setting the power requirement of the computer module to the estimated maximum power demand if the computer module has a job assigned by the job scheduler; and
setting the power requirement of the computer module to a value reduced by a predetermined amount relative to the estimated maximum power demand if computer module does not have a job assigned by the job scheduler;
determine a power requirement of the computing system based on the respective power requirements of the computer modules of the computing system;
determine a new OCP threshold based on the power requirement; and
instruct the power subsystem to change a value of the OCP threshold parameter to a new value based on the new OCP threshold.

2. The computing system of claim 1,
wherein the system controller is further to, in determining the power requirement of the computing system:
sum the respective power requirements of the computer modules to obtain the power requirement of the computing system.

3. The computing system of claim 1,
wherein the system controller is further to, for each of the computer modules, in determining the power requirement for the computer module:
identify computer components that are installed in the computer module; and
determine the estimated maximum power demand for the computer module based on respective identities of the installed computer components.

4. The computing system of claim 3,
wherein, for each of the computer modules, the estimated maximum power demand for the computer module is based on an estimate of a maximum power demand associated with each of the installed computer components.

5. The computing system of claim 1,
wherein the system controller is further to, in determining the new OCP threshold, set the new OCP threshold to accommodate the power requirement of the computing system and a predetermined surplus power amount.

6. The computing system of claim 1,
wherein the system controller is further to, in determining the new OCP threshold, set the new OCP threshold to accommodate the power requirement of the computing system multiplied by a proportionality constant.

7. The computing system of claim 1,
wherein the system controller is further to, in determining the new OCP threshold, prevent the new OCP threshold from being lower than a specified minimum value.

8. The computing system of claim 1,
wherein the system controller is further to determine the new OCP threshold in response to a configuration change of the computing system.

9. The computing system of claim 1,
wherein the system controller is further to:
determine the new OCP threshold in response to determining that:
one of the plurality of computer modules is uninstalled;
a configuration of one of the plurality of computer modules is changed by addition or removal of a computer component; and
a new computer module is installed in one of the computer module bays.

10. A method of controlling a computing system, the method comprising:
determining a set of computer modules installed in corresponding computer module bays of the computing system, wherein the computing system includes a power subsystem that is to supply power to the set of computer modules and implement overcurrent protection (OCP) based on an OCP threshold parameter;
during normal operation of the computing system, periodically:
determining respective job assignments by a job scheduler to the computer modules of the computing system;
determining respective power requirements for the computer modules by, for each computer module:
determining an estimated maximum power demand of the computer module based on a current configuration of the computer module;
setting the power requirement of the computer module to the estimated maximum power demand if the computer module has a job assigned by the job scheduler; and
setting the power requirement of the computer module to a value reduced by a predetermined amount relative to the estimated maximum power demand if computer module does not have a job assigned by the job scheduler;
determining a power requirement of the computing system based on the respective power requirements of the computer modules of the computing system;
determining a new OCP threshold based on the power requirement; and
instructing the power subsystem to change a value of the OCP threshold parameter to a new value based on the new OCP threshold.

11. The method of claim 10,
wherein determining the power requirement of the computing system further comprises:
summing the power requirement of a respective computer module to obtain the power requirement of the computing system.

12. The method of claim 11,
wherein determining the power requirement of the computer module further comprises:
identifying computer components installed in the computer module; and
determining the power requirement for the computer module based on respective identities of the installed computer components.

13. The method of claim 10, wherein determining the new OCP threshold further comprises setting the new OCP threshold to accommodate one of:
 the power requirement of the computing system and a predetermined surplus power amount; and
 the power requirement of the computing system multiplied by a proportionality constant.

14. The method of claim 10, wherein determining the new OCP threshold further comprises preventing the new OCP threshold from being lower than a specified minimum value.

15. A non-transitory machine readable medium storing instructions that are executable by a processor of a computing system, the instructions causing the processor to:
 determine a set of computer modules installed in corresponding computer module bays of the computing system, wherein the computing system includes a power subsystem that is to supply power to the set of computer modules and implement overcurrent protection (OCP) based on an OCP threshold parameter;
 during normal operation of the computing system, periodically:
  determine respective job assignments by a job scheduler to the computer modules of the computing system;
  determine respective power requirements for the computer modules by, for each computer module:
   determining an estimated maximum power demand of the computer module based on a current configuration of the computer module;
   setting the power requirement of the computer module to the estimated maximum power demand if the computer module has a job assigned by the job scheduler; and
   setting the power requirement of the computer module to a value reduced by a predetermined amount relative to the estimated maximum power demand if computer module does not have a job assigned by the job scheduler;
  determine a power requirement of the computing system based on the respective power requirements of the computer modules of the computing system;
  determine a new OCP threshold based on the power requirement; and
  instruct the power subsystem to change a value of the OCP threshold parameter to a new value based on the new OCP threshold.

16. The non-transitory machine readable medium of claim 15, wherein the instructions cause the processor to determine the power requirement of the computing system by:
 summing the power requirement of a respective computer module to obtain the power requirement of the computing system.

17. The non-transitory machine readable medium of claim 16, wherein the instructions cause the processor to determine the power requirement of the computer module by:
 identifying computer components installed in the computer module; and
 determining the power requirement for the computer module based on respective identities of the installed computer components.

18. The non-transitory machine readable medium of claim 15, wherein the instructions cause the processor to determine the new OCP threshold in response to determining that:
 one of the set of computer modules is uninstalled;
 a configuration of one of the set of computer modules is changed by addition or removal of a computer component; and
 a new computer module is installed in one of the computer module bays.

19. The non-transitory machine readable medium of claim 15, wherein the instructions cause the processor to determine the new OCP threshold by setting the new OCP threshold to accommodate one or more of:
 the power requirement of the computing system and a predetermined surplus power amount;
 the power requirement of the computing system multiplied by a proportionality constant; and
 a specified minimum value.

* * * * *